United States Patent
Ishikawa et al.

[11] Patent Number: 6,154,118
[45] Date of Patent: Nov. 28, 2000

[54] CIRCUIT PROTECTIVE DEVICE WITH POSITIVE TEMPERATURE COEFFICIENT ELEMENT AND ELECTRIC JUNCTION BOX WITH THE DEVICE

[75] Inventors: Satoshi Ishikawa; Osamu Soda, both of Shizuoka, Japan

[73] Assignee: Yazaki Corporation, Tokyo, Japan

[21] Appl. No.: 09/321,619

[22] Filed: May 28, 1999

[30] Foreign Application Priority Data

Jun. 5, 1998 [JP] Japan .................................. 10-157613

[51] Int. Cl.[7] ...................................................... H01C 7/13
[52] U.S. Cl. ...................... 338/22 R; 338/315; 361/807; 361/812
[58] Field of Search .................. 338/22 R, 315, 338/277; 361/807, 811, 812

[56] References Cited

U.S. PATENT DOCUMENTS

| | | | |
|---|---|---|---|
| 3,311,791 | 3/1967 | Larson et al. | 317/101 |
| 3,849,838 | 11/1974 | Hehl | 361/812 |
| 4,481,498 | 11/1984 | McTavish et al. | |
| 5,117,089 | 5/1992 | Honkomp et al. | 219/201 |
| 5,233,326 | 8/1993 | Motoyoshi | 338/22 R |
| 5,247,277 | 9/1993 | Fang et al. | 338/22 R |
| 5,929,743 | 7/1999 | Miyazaki et al. | 338/22 R |

FOREIGN PATENT DOCUMENTS

| | | |
|---|---|---|
| 58-190230 | 11/1983 | Japan . |
| 9401867 | 1/1994 | WIPO .................................. 338/22 R |

*Primary Examiner*—Karl D. Easthom
*Attorney, Agent, or Firm*—Armstrong, Westerman, Hattori, McLeland & Naughton

[57] ABSTRACT

A circuit protective device with a positive temperature coefficient element is provided, which includes: a positive temperature coefficient (hereinafter "PTC") element, made of a conductive composition having a PTC characteristics, provided for shutting off an electric circuit; a circuit board having the PTC element and electrodes to be connected with the PTC element; and a slot formed on the circuit board so as to prevent a low resistance conductive passage from being formed between the electrodes, the low resistance conductive passage being made of powder of the conductive composition released from the PTC element. And also an electric junction box with the above circuit protective device is provided. Thus, the circuit protective device or the electric junction box with the circuit protective device wherein a low resistance conductive passage made of a carbonaceous powder to be released from the PTC element is not formed between the electrodes of the PTC element can be realized.

3 Claims, 2 Drawing Sheets

CIRCUIT PROTECTIVE DEVICE WITH POSITIVE TEMPERATURE COEFFICIENT ELEMENT AND ELECTRIC JUNCTION BOX WITH THE DEVICE

BACKGROUND OF THE INVENTION

1. Field of the Invention

The present invention generally relates to a circuit protective device with a positive temperature coefficient (hereinafter "PTC") element and also to an electric junction box with the circuit protective device and, more particularly, to the circuit protective device and to the electric junction box wherein a low resistance conductive passage made of a carbonaceous powder to be released from the PTC element is not formed between the electrodes of the PTC element.

2. Description of the Related Art

In a circuit protective device for overload current using a PTC element made of a conductive polymeric composition having PTC characteristics, an electric circuit is shut off by raising the electric resistance of the PTC element due to temperature rise thereof caused by an abnormal current.

Such a circuit protective device is provided in an electric junction box mounted on a vehicle such as an automobile, while keeping a safe state when the circuit is shut off by the PTC element. More specifically, since the PTC element is apt to release carbonaceous powder and the powder would accumulate on a circuit board on which the PTC element is attached through lead wires thereof, a low resistance conductive passage could be formed, thereby causing a failure of the circuit.

In Japanese Patent Application Laid-open No. 58-190230, a circuit protective device with a structure described below for keeping the above safe state is disclosed.

Referring to FIG. 3, the circuit protective device 1 is constructed such that a cup-like electrode 4 having a lead wire 3 is attached to each of the ends of a PTC element 2, the PTC element 2 along with the electrodes 4 is accommodated in a metal tube 6 covered with an insulating tape 5, and insulating circular plates 7 are attached to the respective ends of the tube 6. The circuit protective device 1 is mounted on a circuit board (not shown) as a parts of an electric circuit shown in FIG. 4. Here, reference numerals 8 and 9 indicate a power unit and an electrical load, respectively.

In this prior art, forming of the above low resistance conductive passage is prevented by means of accommodating the PTC element 2 in the metal tube 6 with the insulating circular plates 7, thereby keeping the safe state.

With respect to the prior art circuit protective device, however, a number of parts required for the device causes the high cost and simultaneously complicated assembly work. This, of course, causes an increase in the cost of an electric junction box with the circuit protective device 1.

SUMMARY OF THE INVENTION

In view of the foregoing, an object of the present invention is to provide a circuit protective device with a PTC element and also an electric junction box with the circuit protective device wherein a safe state can be kept with high reliability in case an electric circuit is shut off based on a rise in the electric resistance of the PTC element and also the manufacturing cost is lower.

In order to achieve the above-described object, in a first aspect of the present invention, a circuit protective device with a PTC element includes: a PTC element, made of a conductive composition having a PTC characteristic, provided for shutting off an electric circuit; a circuit board having the PTC element and electrodes to be connected with the PTC element; and a slot formed on the circuit board so as to prevent a low resistance conductive passage from being formed between the electrodes, the low resistance conductive passage being made of powder of the conductive composition released from the PTC element.

According to the above-described structure, even if the carbonaceous powder is released from the PTC element due to an abnormal current, which would cause a fault of the PTC element, in the circuit, the low resistance conductive passage can not be formed since the carbonaceous powder drops through the slot provided between the electrodes on the circuit board.

And, since the slot can be formed simultaneously when electrodes or holes for, e.g., other electronic parts or the like are formed in a manufacturing process of the circuit board, forming the slot is very easy, thereby saving the cost.

Accordingly, a safe state can be kept with high reliability in case the circuit is shut off based on a rise in the electric resistance of the PTC element and also the manufacturing cost is lower.

As a second aspect of the present invention, in the structure with the above first aspect, the slot extends orthogonally to a direction connecting the electrodes.

According to the above-described structure, since the slot is formed orthogonally to a direction connecting the electrodes, the slot can prevent a low resistance conductive passage from being formed.

Further, as a third aspect of the present invention, an electric junction box equipped with a circuit protective device with a PTC element includes a circuit protective device consisting of: a PTC element, made of a conductive composition having a PTC characteristics, provided for shutting off an electric circuit; a circuit board having the PTC element and electrodes to be connected with the PTC element; and a slot formed on the circuit board so as to prevent a low resistance conductive passage from being formed between the electrodes, the low resistance conductive passage being made of powder of the conductive composition released from the PTC element.

According to the above-described structure, since the electric junction box is equipped with the circuit protective device with the PTC element, a safe state of the electric junction box can be kept with high reliability in case the circuit is shut off based on a rise in the electric resistance of the PTC element, thereby enabling the electric junction box to have high reliability at a reasonable price.

The above and other objects and features of the present invention will become more apparent from the following description taken in conjunction with the accompanying drawings.

DESCRIPTION OF THE PREFERRED EMBODIMENT

An embodiment of the present invention will now be described in further detail with reference to the accompanying drawings.

Figures 1, 1A:
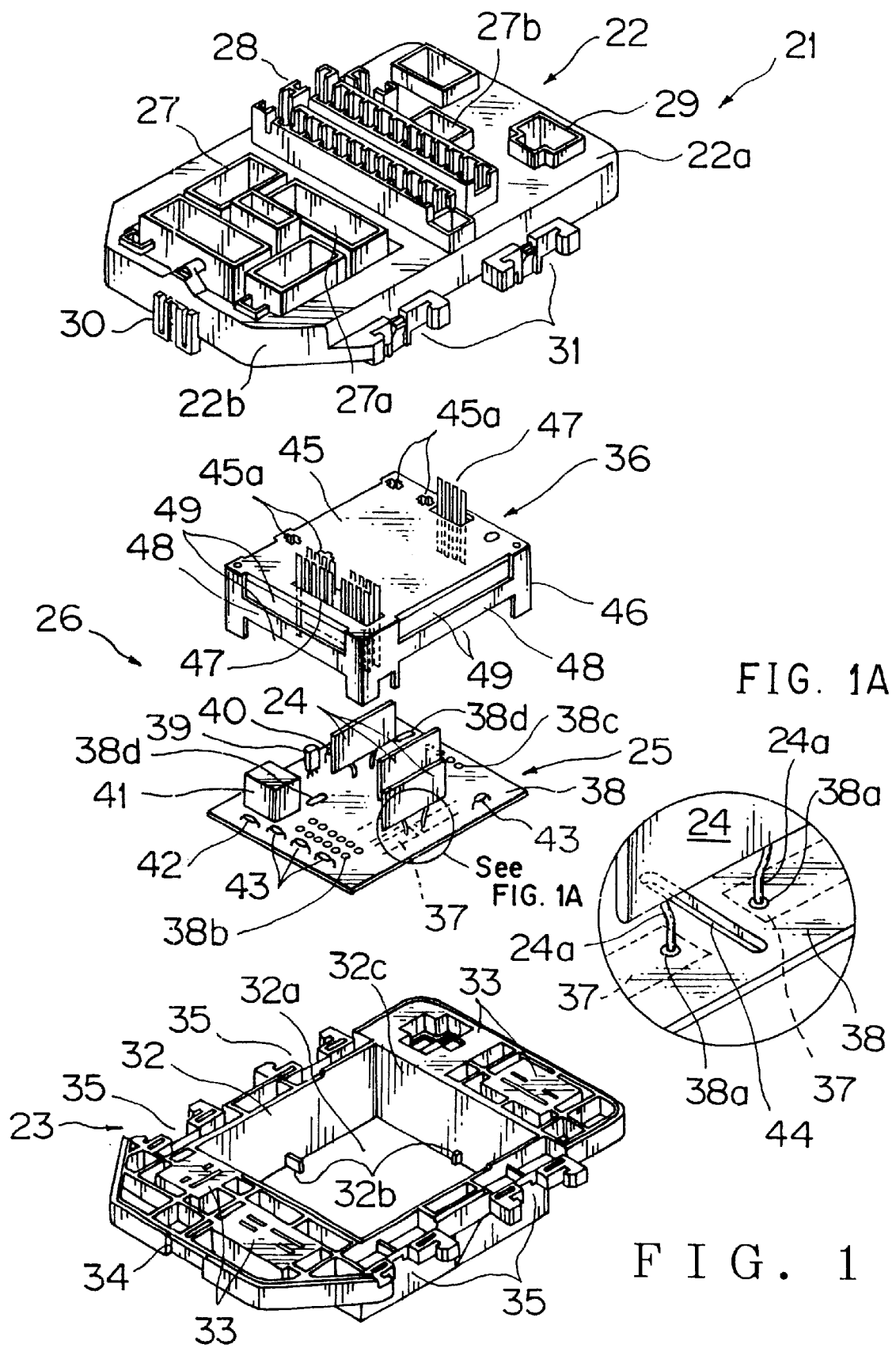
FIG. 1 is an exploded perspective view showing an embodiment of an electric junction box having a circuit protective device with a PTC element in accordance with the present invention.
Figure 2:
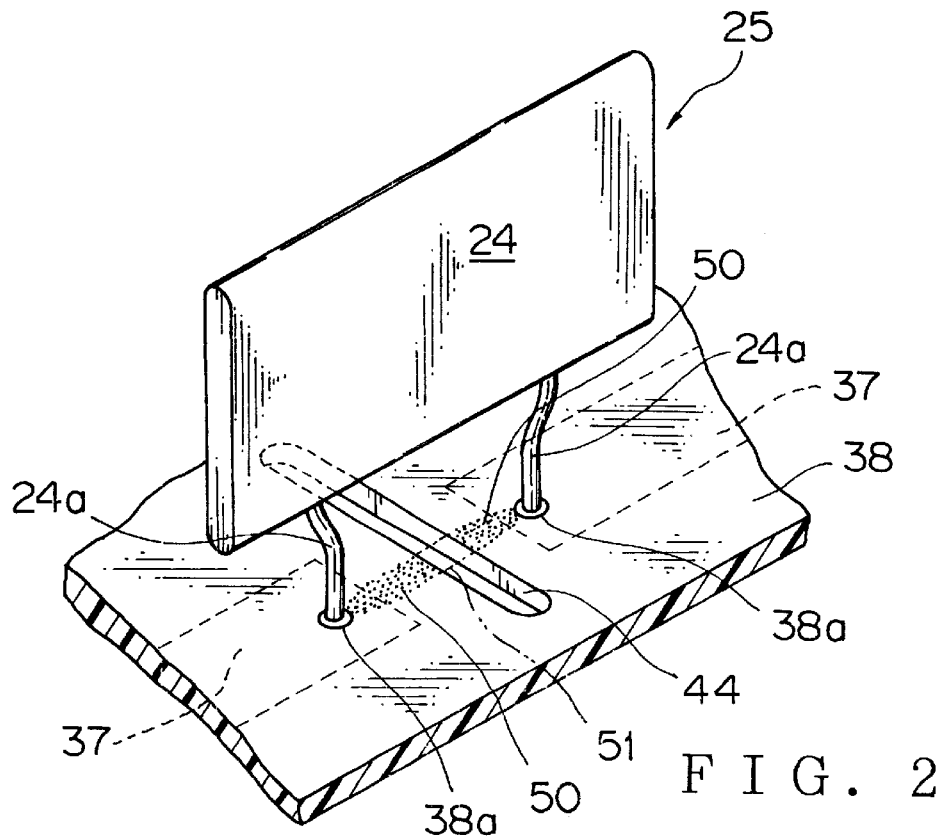
FIG. 2 is a perspective view showing the circuit protective device with the PTC element of FIG. 1 in a state that a carbonaceous powder is accumulated under the PTC element.
Figure 3:
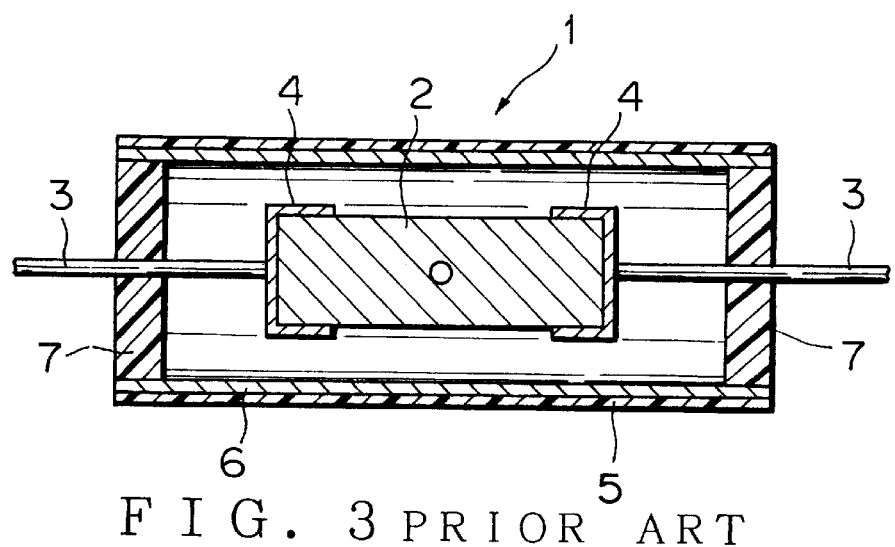
FIG. 3 is a longitudinal sectional view showing a prior art circuit protective device with a PTC element.
Figure 4:
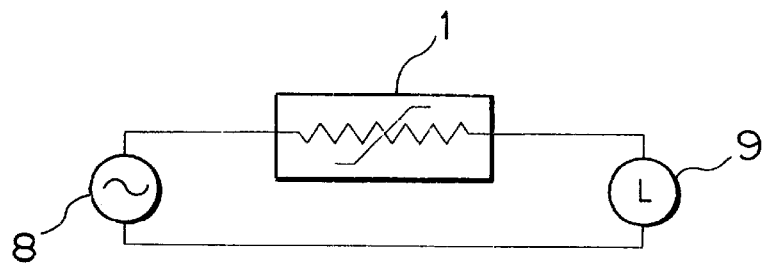
FIG. 4 is a diagram of an electric circuit with the circuit protective device of FIG. 3.

FIG. 1 shows an embodiment of an electric junction box having a circuit protective device with a PTC element, and FIG. 2 shows the circuit protective device with the PTC element of FIG. 1, with a carbonaceous powder under the PTC element.

Referring to FIG. 1, reference numeral 21 indicates an electric junction box to be mounted on a vehicle such as an automobile. The electric junction box 21 consists of an upper casing 22, a lower casing 23, and a power cable board assembly 26 having a circuit protective device 25 with a plurality of PTC elements 24 and to be accommodated between the casings 22,23.

On an upper wall portion 22a of the upper casing 22, circuit element connecting portions 27,28, and 29 for electric connectors, fuses, and relays (each not shown), respectively, are formed. And, on a side wall portion 22b, a plurality of upper engaging portions 30,31 relative to the lower casing 23 is provided. Further, in the upper casing 22, a circuit board (not shown) is mounted.

On the lower casing 23, a concavity 32 for accommodating the power cable board assembly 26 is formed, which concavity 32 is provided with a plurality of projections 32b to support the circuit protective device 25 on a bottom wall 32a along a side wall 32c. And, near the periphery of the lower casing 23, electrically connecting portions 33 for electric connectors or the like (not shown) are formed, and also a plurality of lower engaging portions 34,35 for engaging a plurality of upper engaging portions 30,31 of the upper casing 22 are formed for coupling the lower casing 23 and the upper casing 22.

The power cable board assembly 26 consists of the circuit protective device 25 and an electric terminal supporting table 36. The circuit protective device 25 has a circuit board 38 with printed circuits 37, and three PTC elements 24 are mounted on the circuit board 38 by soldering lead wires 24a thereof to respective electrodes 38a. Also, on the circuit board 38, a known transistor 39, condenser 40, relay 41, resistance 42, diode 43, and the like are soldered, and further a plurality of electrodes 38b,38c and a slit-like electrode 38d to be connected with an electric terminal (not shown) to be received in a through hole 45a of the electric terminal supporting table 36 are provided.

Further, between the electrodes 38a a slot 44 is provided orthogonally to a direction connecting the electrodes 38a so that the slot 44 can prevent a low resistance conductive passage 51 (specified later) from being formed.

The PTC element 24 is made of such a conductive polymeric composition having a PTC characteristic as a mixture, having conductivity, of a carbon and a polymer like a high density polyethylene or a polyvinylidene fluoride, which PTC element 24 generates heat due to an abnormal current and raise the electric resistance, whereby the circuit is shut off.

On the other hand, the electric terminal supporting table 36 consists of a rectangular table portion 45 and legs 46 formed at each corner of the table portion 45, and a plurality of electric terminals 47 are insert-molded on the table portion 45, one end of which electric terminals 47 are formed in a strip-like shape so as to be put through circuit element connecting portions 27a,27b of the upper casing 22 and the other end thereof are soldered to a plurality of electrodes 38b,38c.

A reinforcement 48 is provided between each of the legs 46, and a side opening 49 for releasing the heat is formed between the reinforcement 48 and the periphery of the table portion 45 and similarly under the reinforcement 48.

In the above structure, a carbonaceous powder 50 would be released from the PTC element 24 by an abnormal current which could cause a fault of the PTC element 24. However, even if the carbonaceous powder 50 is released from the PTC element 24, the low resistance conductive passage 51 can not be formed as shown in FIG. 2 since the carbonaceous powder 50 drops through the slot 44 provided between the electrodes 38a arranged on the circuit board 38.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A circuit protective device with a positive temperature coefficient (hereinafter "PTC") element, comprising:
   a PTC element, made of a conductive composition having a PTC characteristic, provided for shutting off an electrical circuit;
   a circuit board having said PTC element and electrodes to be connected with said PTC element, said PTC element being mounted on entirely one side of said circuit board; and
   a slot formed under said PTC element between said electrodes on said circuit board so as to prevent a low resistance conductive passage from being formed between said electrodes.

2. The circuit protective device according to claim 1, wherein
   said slot extends orthogonally to a direction connecting said electrodes.

3. An electric junction box equipped with a circuit protective device with a positive temperature coefficient (hereinafter "PTC") element, including a circuit protective device, comprising:
   a PTC element, made of a conductive composition having a PTC characteristic, provided for shutting off an electrical circuit;
   a circuit board having said PTC element and electrodes to be connected with said PTC element, said PTC element being mounted on entirely one side of said circuit board; and
   a slot formed under said PTC element between said electrodes on said circuit board so as to prevent a low resistance conductive passage from being formed between said electrodes.

* * * * *